United States Patent [19]
Rosen et al.

[11] 3,984,787
[45] Oct. 5, 1976

[54] TWO-INDUCTOR VARACTOR TUNABLE SOLID-STATE MICROWAVE OSCILLATOR

[75] Inventors: Jerome Rosen; Edgar Jacob Denlinger, both of East Windsor, N.J.

[73] Assignee: RCA Corporation, New York, N.Y.

[22] Filed: July 28, 1975

[21] Appl. No.: 599,590

[52] U.S. Cl. .............................. 331/107 R; 331/99; 331/101
[51] Int. Cl.² ............................................ H03B 7/14
[58] Field of Search ........ 331/177 V, 107 R, 107 G, 331/101, 102, 99, 100, 96

[56] References Cited
UNITED STATES PATENTS

| | | | |
|---|---|---|---|
| 3,336,535 | 8/1967 | Mosher | 331/99 |
| 3,599,118 | 8/1971 | Large | 331/96 |
| 3,735,286 | 5/1973 | Vane | 331/107 G |
| 3,739,298 | 6/1973 | Kawakami | 331/107 G |
| 3,793,539 | 2/1974 | Clorfeine | 331/107 R |
| 3,868,588 | 2/1975 | Schwartzmann et al. | 331/99 |
| 3,868,594 | 2/1975 | Cornwell et al. | 331/99 |

Primary Examiner—John Kominski
Attorney, Agent, or Firm—Edward J. Norton; Joseph D. Lazar; Robert M. Rodrick

[57] ABSTRACT

A two-inductor varactor tunable solid-state microwave oscillator comprising a series tunable circuit wherein one inductor is serially connected with a negative resistance active element, an impedance load, and a varactor. The circuit is tuned by changing the reactance of the circuit by varying electrically the capacitance of the varactor. The second inductor is connected in parallel with the varactor to increase the range of reactance change of the series circuit effected by the variation in capacitance of the varactor to provide thereby for a wider frequency tuning range.

7 Claims, 6 Drawing Figures

TWO-INDUCTOR VARACTOR TUNABLE SOLID-STATE MICROWAVE OSCILLATOR

The invention herein described was made in the course of or under a contract or subcontract thereunder with the Department of the Navy.

BACKGROUND OF THE INVENTION

Field of the Invention

This invention relates to an electrically tunable solid-state microwave oscillator and more particularly to an oscillator having a two-inductor tunable series circuit for a wide range of frequency tunability.

Description of the Prior Art

A continuing need exists for wide-band electrically tunable, solid-state microwave oscillators wherein an active element generates a signal of a particular frequency in the microwave frequency bands dependent upon electrical circuit parameters which form a resonant circuit. Tuning of such oscillators is achieved typically by varying one or more of these circuit parameters so that the frequency of oscillation is changed for desired applications.

In the prior art, there are various wide-band electrically tunable solid-state microwave oscillators in which the oscillating frequency is controlled by variable reactance means. In general, these oscillators require the use of ferrite devices or varactors as the tuning element. Wide-band tuning has been achieved with a ferrite device, such as a YIG (yttrium-iron-garnet) sphere but the slowness of tuning due to the reaction in the magnetic circuit is a disadvantage. The added weight of the electromagnet to the structure and the power consumption of the unit are other problems related to these tunable oscillators using YIG spheres. Varactors are used for rapid tuning of microwave oscillators but the tuning range has been generally less than that of magnetic tuning. Increases in the tuning range in varactor tunable oscillators have been obtained, however, by sacrificing power output and oscillator performance efficiency.

Because high tuning rates are more desirable in present microwave systems and the development of electronic devices is toward more compact packages, the varactor tunable oscillator is more attractive than magnetically tuned devices. Many of the prior art devices have, therefore, used variations of varactor tunable circuits to increase the range of frequency tunability. Where the widest possible tuning range is required, a series circuit comprising a varactor connected in series with an active element and an impedance load has been used. As is well-known in the art, series tunable circuits are preferable for wide-band tuning since parallel tunable circuits result in inherently narrower tuning ranges.

U.S. Pat. No. 3,599,118, entitled "Varactor Tuned Negative Resistance Diode Microwave Oscillators," and issued on Aug. 10, 1971, discloses one type of prior art varactor tunable oscillator which includes a plurality of variable impedance devices connected in series with the transmission line center conductor to provide for tunability by modifying the effect of the reactance of the circuit to achieve the desired frequency modulation. U.S. Pat. No. 3,739,298, entitled "Broad Band Tunable Solid-State Microwave Oscillator," and issued on June 12, 1973, describes a varactor connected in series between first and second conductors of a transmission line wherein one or both conductors are adjustably mounted to effect adjustment of the characteristic impedance of the line and thus frequency tunability of the device. The tuning ranges for the devices described in these two patents as a percentage of the center frequency of tunable bandwidth are 66⅔ percent and 50 percent, respectively. The generated frequencies of these oscillators, however, are within the range of 3 GHz to 11 GHz. One embodiment of the present invention is directed to an oscillator which is tunable in the Ka band which is over a range from 26.5 GHz to 40.0 GHz, which provides particulary for improved operation of a varactor tunable oscillator at higher microwave frequencies.

U.S. Pat. No. 3,735,286, entitled "Varactor Tuned Coaxial Cavity Negative Resistance Diode Oscillator," and issued on May 22, 1973, discloses an oscillator in which one varactor is connected in series with the active element and another varactor is connected in shunt with the active element to provide for wide-band tunability of the oscillator. In Ka band, this varactor tunable device utilizing only the shunt varactor is stated to have a tuning range of approximately 6 percent viz., 2 GHz, of the electronic tunable bandwidth. The present invention is an improvement over this type of varactor tunable oscillator since it is capable, as will be described, of achieving a tuning range greater than 40 percent of the center frequency in Ka band for a particular preferred embodiment.

Another problem encountered by many of the prior art varactor tunable oscillators in attempting to achieve wide-band tuning in high microwave frequency bands is the degradation of performance due to the high resistance of the varactors used in the oscillator circuit. In a series circuit, wide-band tuning is more desirably achieved by varactors which have large capacitance ratios, that is, the ratio of the maximum variable capacitance to the minimum. The so-called hyperabrupt varactors possess large capacitance ratios lending themselves to wide-band tuning applications but these varactors also have a relatively high resistance value. Where the resistance of the varactor, which is in series with the active element, exceeds the absolute value of the negative resistance of the active element, the oscillator performance in terms of output power and efficiency will be degraded. In particular, IMPATT diodes, which are used in oscillators advantageously for their high power and other improved operating characteristics, have relatively low associated negative resistance values. When hyperabrupt type high resistance varactors are used in combination with such low negative resistance IMPATT diodes, the oscillator performance will degrade significantly and the tunability will be ineffective.

The present invention is an improvement over known varactor tunable oscillators in that it provides for wide-band tunability by utilizing in combination with two inductors a varactor having an abrupt junction which has a capacitance ratio less than the hyperabrupt type varactor, and also provides for stability of oscillator performance due to the lower resistance values associated with the abrupt type varactor.

SUMMARY OF THE INVENTION

According to the present invention, an electrically tunable solid-state microwave oscillator comprising a tunable series circuit is formed to operate at a range of desired frequencies. The series circuit includes a negative-resistance active element serially connected with an impedance load, a first inductor and a varactor defining a series circuit reactance. The circuit is frequency tuned by changing the series circuit reactance by varying electrically the capacitance of the varactor. A second inductor is provided to improve the range of frequency tunability. The second inductor is connected in parallel with the varactor, the parallel combination having an effective reactance. The effective reactance formed by the parallel combination provides for an increase in the range of the series circuit reactance changes effected by the variation in capacitance of the varactor. The range of frequency tunability effected by the changes in varactor capacitance is thereby increased.

DETAILED DESCRIPTION OF THE PREFERRED EMBODIMENT

Figure 1A:
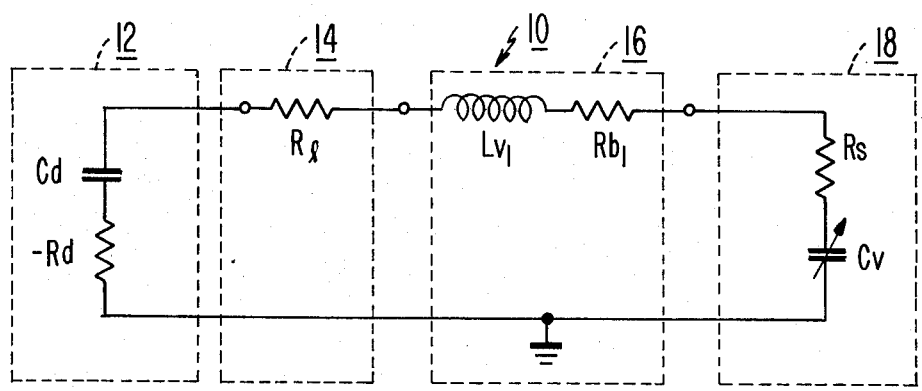
FIGS. 1(a) and 1(b) are electrical circuits of prior art solid-state microwave oscillators including a series tunable circuit with a varactor as the tuning element.

Referring to FIG. 1(a), there is shown a schematic of a prior art solid-state microwave oscillator having an electrically tunable series circuit 10. Tunable series circuit 10 includes a negative resistance active element 12 connected in series with an impedance load 14, and inductor 16 and a varactor 18. Active element 12 is of the type which exhibits a negative resistance −Rd at microwave frequencies at a selected bias level and has an associated capacitance Cd. Typically, an active element having these characteristics may be in the form of any known negative resistance device such as a GUNN effect diode, tunnel diode, IMPATT diode, TRAPATT diode, or LSA diode.

Figure 1B:
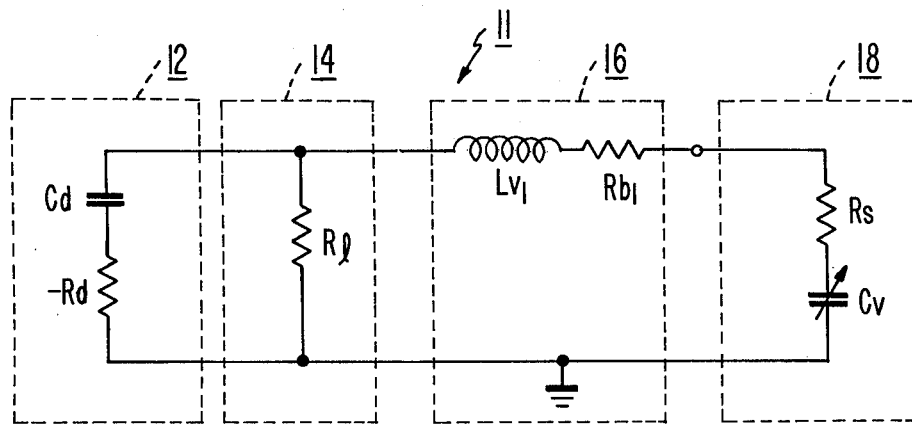

In many of the prior art oscillators are tunable series circuit has been modified as shown in FIG. 1(b). Where the impedance load 14 is in series with the active element 12 as illustrated in FIG. 1(a), the value of the total series resistance which includes the impedance of the load 14 together with the resistances associated with the other components must be lower than the absolute value of the negative resistance −Rd of the active element to assure satisfactory oscillator operation and prevent performance degradation. However, with the use of active elements having low values of negative resistance, achieving structurally a load which has a sufficiently low impedance to keep the total series resistance lower than the value of the negative resistance is difficult, if not impossible. Therefore, the impedance load 14 is connected in shunt with the active element 12 allowing for the use of practical loads having larger valued impedances. By providing such a load with a substantially high value of impedance, for example above two hundred ohms, the tunability effect of the series resonant circuit will not be significantly altered.

As discussed in the prior art section above, tunable series circuits are used for wide range tunability in oscillators containing a negative resistance active element and a varactor as the tuning element. In the series circuits shown in FIG. 1(a) and (b), the inductance Lv₁ of the inductor 16 in combination with the variable capacitance Cv of the varactor 18 and the active element capacitance Cd form a resonant circuit which has a series circuit reactance determining the resonant frequency of the circuit. Tuning to the resonant frequency is accomplished by changing the circuit reactance, more particularly, by varying the value of the capacitance Cv. As the change of circuit reactance provided in such oscillators is made greater, the range of frequency tunability will become wider.

To achieve a wide tuning range, many of the prior art devices are provided with a varactor having a large capacitance ratio, this ratio being defined as the ratio of the maximum capacitance to the minimum capacitance of the varactor. Known varactors which possess the highest capacitance ratios are of the type which have a hyperabrupt diode junction generally having a capacitance ratio greater than six to one. Such hyperabrupt varactors have a doping distribution of the diode junction which provides for increased range of minimum to maximum capacitance for a given range of applied bias voltage. Varactors which have a capacitance ratio of approximately six to one or less are generally of the type which have an abrupt diode junction. The hyperabrupt doping profile is achieved by epitaxial growth process which is a more difficult fabrication method than that for the abrupt profile which is usually achieved by the standard alloying or diffused mesa techniques.

Besides the differences in varactor capacitance ratio and construction, the hyperabrupt varactors have a higher associated resistance Rs than that of abrupt varactors. In the tunable series circuit this varactor resistance Rs is significant in determining the performance of the oscillator. As explained previously, where the resistance Rs exceeds the absolute value of the negative resistance −Rd of the active element the oscillator power and efficiency will decrease and the performance will degrade. Thus, the use of the hyperabrupt varactors for the purpose of wide range tuning presents a difficult oscillator performance problem in series circuits incorporating active elements such as IMPATT diodes which have low values of negative resistance.

Figure 2:
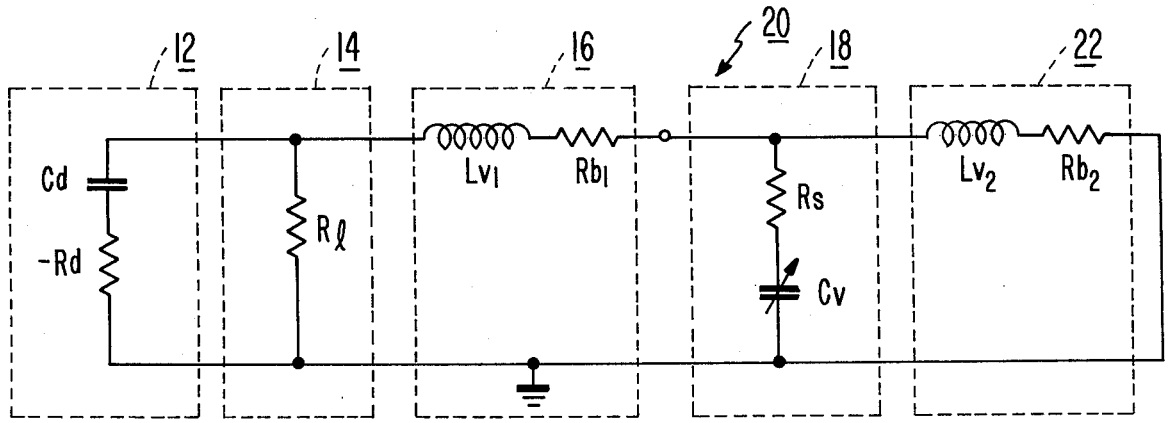
FIG. 2 is an electrical circuit of an electrically tunable solid-state microwave oscillator according to a preferred embodiment of the invention.

Referring now to FIG. 2, there is shown a schematic for an improved solid-state electrically tunable microwave oscillator according to the present invention for wide range tunability using a varactor as the tuning element. In a preferred embodiment of the invention, a series tunable circuit 20 comprising the elements as shown in FIG. 1(b) further comprises a second inductor 22 connected in parallel with varactor 18. In this preferred embodiment, active element 12 is an IMPATT diode although any of the negative resistance active elements described above may be used. It is to be understood that the improved tunable series circuit may also be in the form of the series circuit depicted in FIG. 1(a). In the embodiment illustrated in FIG. 2 it is preferrable that varactor 18 be of the abrupt diode junction type although a varactor of the hyperabrupt diode junction type may also be used. Inductor 22 has an inductance $Lv_2$ which combines in parallel with the capacitance $Cv$ of varactor 18 forming thereby an effective combined reactance. The effective reactance of the parallel combination provides for an increase in the range of series circuit reactance changes effected by the variation in capacitance $Cv$ of varactor 18 and the range of frequency tunability is thereby increased.

Figure 3:
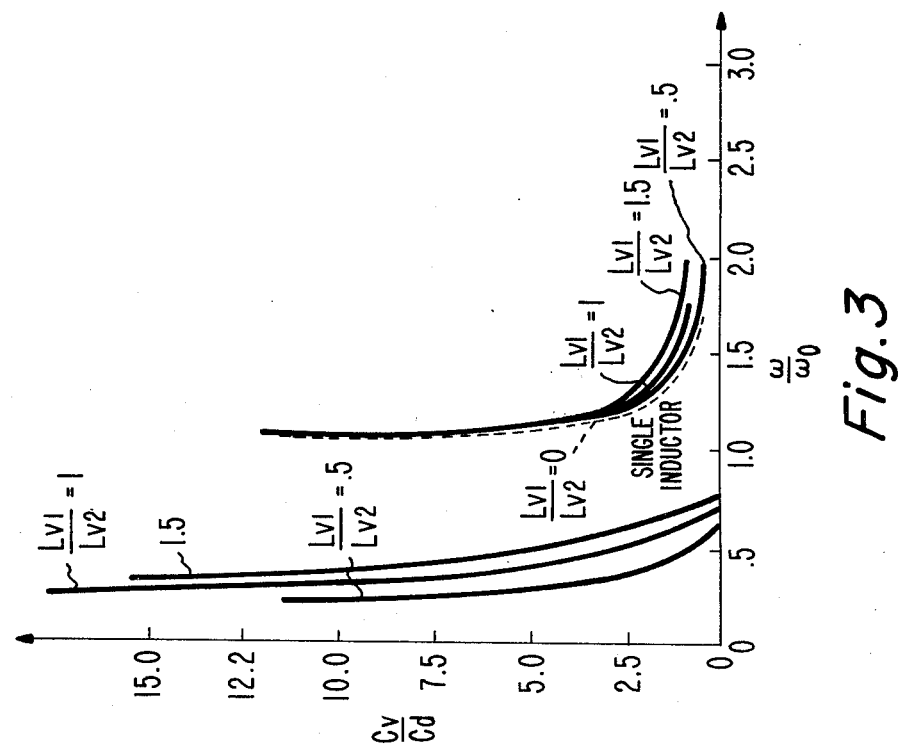
FIG. 3 is a graph illustrating curves representing various operational characteristics of the preferred embodiment of the invention illustrated in FIG. 2.

The tunability of the circuit being thus improved by the addition of inductor 22, wide range tuning capability in series circuits is no longer strictly dependent upon a large varactor capacitance ratio. Referring to FIG. 3, there is shown a graph of $Cv/Cd$ as a function of angular frequency ratio for different values of $Lv_1/Lv_2$ where the value of $Lv_1/Lv_2 = 0$ corresponds to the single-inductor case and $\omega_0$ is the initial angular frequency of the oscillator circuit. There are two branches of the resonant curve shown, one on each side of $\omega/\omega_0 = 1$. The upper branch is more useful in the practice of the preferred embodiment since the other branch requires unreasonable inductance and capacitance values for the desired operation of the oscillator. It is clear that to achieve the same bandwidth as the single-inductor prior art circuit (FIGS. 1(a) or 1(b)) the requirements for the varactor are considerably reduced. A larger minimum varactor capacitance and thereby a smaller capacitance ratio can be used than that used for the single-inductor circuit. Also, since the varactor resistance $Rs$ is proportional to $1/Cv$, a varactor with a smaller series resistance can be utilized to obtain the same bandwidth as with the single-inductor circuit. Conversely, where high values of varactor resistance $Rs$ do not present performance problems and hyperabrupt varactors can be employed, the tunable bandwidth can be increased over the single-inductor oscillator.

In a preferred embodiment of the invention which is capable of tuning over the Ka band, i.e., from 26.5 GHz to 40.0 GHz, the following table indicates the various varactor capacitances required for the single and two-inductor circuits.

plane 36. Output transformer 40 is conductively attached to conductive strip 33, transformer 40 being a two-section quarter-wave transformer to provide an impedance load having a value greater than 200 ohms for the preferred embodiment where the load is connected in parallel with the active element. Output microstrip 32 is connected to a microstrip waveguide transition 72 which transmits the signal generated in the oscillator to the output waveguide (not shown).

An IMPATT diode 42 is mounted on block 38, the upper IMPATT diode terminal 43 being connected to ouput transformer 40 by connection lead 50. Connection lead 50 also attaches IMPATT diode 42 to a diode bias filter 66 which is conductively connected to a diode bias port 68 to provide a means to apply a bias voltage to diode 42.

A varactor 46, preferably having an abrupt diode junction, is mounted on a blocking capacitor 48, blocking capacitor 48 having a high capacitance to restrict the RF signal to the microstrip circuit. Blocking capacitor 48 is secured to an insert 74 which is mounted into a recess 44 formed in block 38. Upper terminal 43 of IMPATT diode 42 is connected to the upper terminal 47 of varactor 46 by a first inductor 52.

A second blocking capacitor 54 having substantially the same capacitance as first capacitor 48 is mounted on a second insert 76 which is mounted within recess 44. A second inductor 56 is connected from upper terminal 47 of varactor 46 to second blocking capacitor 54. A connection lead 64 connects second blocking capacitor 54 to varactor bias filter 58 which is conductively attached to a varactor bias port 70 to provide a means to apply a bias voltage to varactor 46.

It is preferable that first inductor 52 and second inductor 56 be formed of gold wire, having a diameter of 1 mil, the lengths being determined by the value of the inductances selected. Inductors 52 and 56 may also be formed of ribbon having a thickness of ½ mil and a width of 3 to 4 mils, the length being determined in the

| | | | | SINGLE-INDUCTOR | | | TWO-INDUCTOR | | |
|---|---|---|---|---|---|---|---|---|---|
| Case | Cd1 (pF) | Cd2 (pF) | Lv1=Lv2 (nh) | Cv1 (pF) | Cv2 (pF) | $\frac{Cv1}{Cv2}$ | Cv1 (pF) | Cv2 (pF) | $\frac{Cv1}{Cv2}$ |
| 1 | .217 | .298 | .216 | .72 | .09 | 8.00 | .892 | .170 | 5.23 |
| 2 | .155 | .213 | .353 | .30 | .05 | 6.00 | .402 | .102 | 3.95 |
| 3 | .120 | .168 | .472 | .21 | .035 | 6.00 | .287 | .075 | 3.80 |

From this table it can be seen that the capacitance ratios for tuning in the Ka band are much less for the two-inductor circuit than the single inductor case. Furthermore, the lower capacitance ratios indicate that the abrupt junction varactors can be used in the oscillator circuit without thereby degrading oscillator performance while achieving the desired wide-band tunability.

Figure 4:
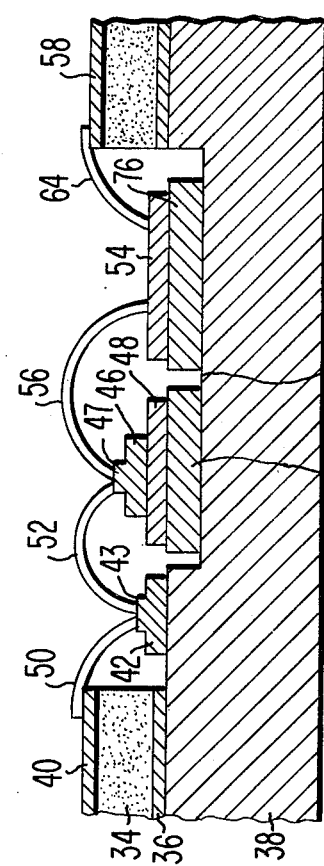
FIG. 4 is a plan view of the structure of the electrically tunable solid-state microwave oscillator circuit illustrated in FIG. 2.
Figure 5:
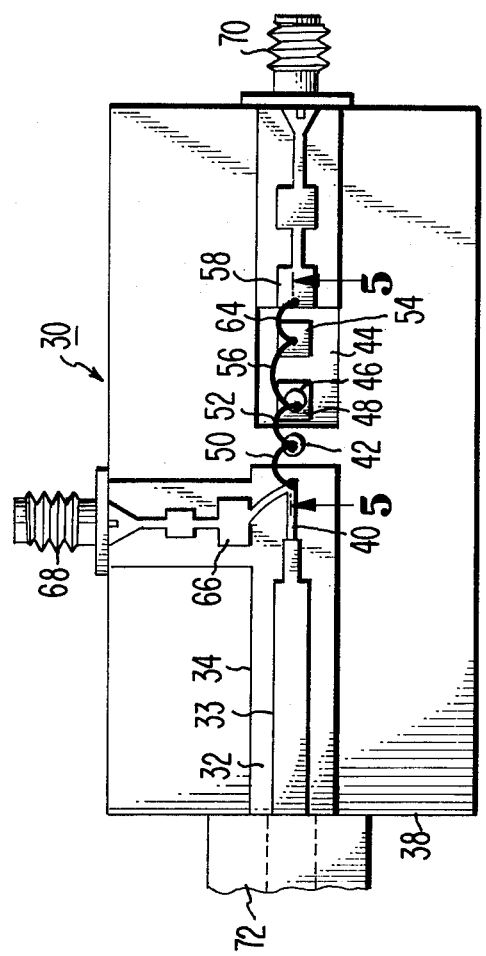
FIG. 5 is a sectional view of the fragmentary portion of the oscillator shown in FIG. 4 as seen along viewing line 5—5 thereof.

Referring now to FIGS. 4 and 5 there is shown by way of example the structure of an electrically tunable solid-state microwave oscillator 30 incorporating the preferred embodiment of the invention as illustrated in FIG. 2 and formed to operate over a desired range of frequencies, preferably in the Ka band. The elements of oscillator 30, it will be understood, represent in physical form the electrical components depicted in FIG. 2. The relationship of the two will be readily apparent to those skilled in this art. Mounted on a copper mounting block 38 used as a ground plane and a heat sink is an output microstrip line 32 comprising a narrow conductive strip 33, dielectric substrate 34 and a wider ground same manner as the wire inductors. Measurements taken of an oscillator of the type described herein indicate a significant improvement over the single-inductor circuit for Ka band applications. Even though there was a mode jump in this oscillator tuning curve at approximately 33 GHz, the two-inductor oscillator exhibited nearly a 50 percent improvement in the range of tunability over the single-inductor circuit for the same range of applied varactor bias voltage.

What is claimed is:

1. In an electrically tunable solid-state microwave oscillator of the type having a tunable series circuit formed to operate at a desired range of frequencies, wherein said series circuit having a series circuit reactance includes a negative resistance active element serially connected with an impedance load means, a first inductive means and a variable capacitive means, wherein said series circuit is frequency tuned by changing said series circuit reactance by varying the capacitance of said variable capacitive means, the improvement comprising a second inductive means connected in parallel with said variable capacitive means, the parallel combination defining an effective reactance, said effective reactance providing thereby for an increase in the range of said series circuit reactance change effected by the variation in capacitance of said variable capacitive means to increase thereby the range of frequency tunability of said series circuit.

2. A microwave apparatus according to claim 1, wherein said negative resistance active element is an IMPATT diode.

3. A microwave apparatus according to claim 1, wherein said variable capacitive means comprises a varactor of the type having an abrupt diode junction, said varactor having a capacitance which is variable as a function of a bias voltage applied to said varactor.

4. A mircowave apparatus according to claim 1, wherein said variable capacitive means comprises a varactor of the type having a hyperabrupt diode junction, said varactor having a capacitance which is variable as a function of a bias voltage applied to said varactor.

5. A microwave apparatus according to claim 1, wherein said first and second inductive means respectively comprises a predetermined length of gold wire having a diameter of one mil, said length being determined by the value of inductance selected.

6. In an electrically tunable solid-state microwave oscillator of the type having a tunable series circuit formed to operate at a desired range of frequencies, wherein said series circuit having a series circuit reactance includes a negative resistance active element serially connected with a first inductive means and a variable capacitive mens, wherein an impedance load means is connected in shunt with said negative resistance active element, wherein said series circuit is frequency tuned by changing said series circuit reactance by varying the capacitance of said variable capactive means, the improvement comprising a second inductive means connected in parallel with said variable capacitive means, the parallel combination defining an effective reactance, said effective reactance providing thereby for an increase in the range of said series circuit reactance change effected by the variation in capacitance of said variable capacitive means to increase thereby the range of frequency tunability of said series circuit.

7. A microwave apparatus according to claim 6, wherein said impedance load means has a resistance value of at least 200 ohms.

* * * * *